(12) United States Patent
Wentink

(10) Patent No.: US 8,897,298 B2
(45) Date of Patent: Nov. 25, 2014

(54) SYSTEMS AND METHODS FOR COMPRESSING HEADERS AND PAYLOADS

(71) Applicant: QUALCOMM Incorporated, San Diego, CA (US)

(72) Inventor: Maarten Menzo Wentink, Breukelen (NL)

(73) Assignee: QUALCOMM Incorporated, San Diego, CA (US)

( * ) Notice: Subject to any disclaimer, the term of this patent is extended or adjusted under 35 U.S.C. 154(b) by 122 days.

(21) Appl. No.: 13/663,837

(22) Filed: Oct. 30, 2012

(65) Prior Publication Data

US 2013/0107895 A1 May 2, 2013

Related U.S. Application Data

(60) Provisional application No. 61/554,562, filed on Nov. 2, 2011, provisional application No. 61/656,403, filed on Jun. 6, 2012.

(51) Int. Cl.
| | |
|---|---|
| *H04L 12/28* | (2006.01) |
| *H04L 29/06* | (2006.01) |
| *H04W 52/02* | (2009.01) |
| *H03M 7/46* | (2006.01) |
| *H04W 28/06* | (2009.01) |

(52) U.S. Cl.
CPC ............... *H03M 7/46* (2013.01); *H04L 69/04* (2013.01); *H04W 52/0219* (2013.01); *H04W 28/06* (2013.01); *H04W 52/0222* (2013.01)
USPC .......................... 370/389; 370/328; 370/471

(58) Field of Classification Search
None
See application file for complete search history.

(56) References Cited

U.S. PATENT DOCUMENTS

| | | | | |
|---|---|---|---|---|
| 5,389,922 A | * | 2/1995 | Seroussi et al. | 341/51 |
| 5,945,933 A | * | 8/1999 | Kalkstein | 341/63 |
| 6,121,903 A | * | 9/2000 | Kalkstein | 341/63 |
| 6,388,584 B1 | * | 5/2002 | Dorward et al. | 341/51 |
| 6,963,570 B1 | * | 11/2005 | Agarwal | 370/395.32 |
| 7,440,473 B2 | | 10/2008 | Kim et al. | |
| 7,570,645 B2 | | 8/2009 | Agarwal | |

(Continued)

FOREIGN PATENT DOCUMENTS

EP 2131501 A1 12/2009

OTHER PUBLICATIONS

"Session Header Compression Scheme Using Differential Run-Length Encoding", IBM Technical Disclosure Bulletin, International Business Machines Corp, (Thornwood), US, vol. 40, No. 12, Dec. 1, 1997, p. 125/126, XP000754111.

(Continued)

*Primary Examiner* — Anh-Vu Ly
(74) *Attorney, Agent, or Firm* — Charles E. Eggers

(57) ABSTRACT

Methods, devices, and computer program products for compressing packet headers and payloads are described herein. In one embodiment, a packet including a packet header and a packet payload is compressed in accordance with a compression map, and the compressed packet is transmitted. The compression map includes a run-length encoded data set identifying at least one data field of the packet header and the packet payload to compress. In another embodiment, a packet including a packet header and a packet payload is received and decompressed in accordance with a decompression map. The decompression map includes a run-length encoded data set identifying at least one data field of the packet header and the packet payload to decompress.

33 Claims, 21 Drawing Sheets

Compression Map: 7 18 2 12 8 4 2 2

(56) References Cited

U.S. PATENT DOCUMENTS

| | | | |
|---|---|---|---|
| 7,643,505 B1* | 1/2010 | Colloff | 370/422 |
| 7,839,852 B2 | 11/2010 | Liu et al. | |
| 8,046,496 B1 | 10/2011 | Nucci et al. | |
| 8,165,165 B2 | 4/2012 | Bae et al. | |
| 8,694,684 B2* | 4/2014 | Verzunov et al. | 709/247 |
| 2004/0139099 A1* | 7/2004 | Weaver | 707/101 |
| 2005/0083944 A1 | 4/2005 | Liu et al. | |
| 2006/0020824 A1* | 1/2006 | Matthews et al. | 713/193 |
| 2006/0048034 A1* | 3/2006 | Cho | 714/749 |
| 2006/0078001 A1* | 4/2006 | Chandra et al. | 370/473 |
| 2006/0291461 A1* | 12/2006 | Stephens | 370/389 |
| 2007/0211724 A1* | 9/2007 | Johansson et al. | 370/392 |
| 2008/0320171 A1* | 12/2008 | Walsh et al. | 709/247 |
| 2009/0099761 A1* | 4/2009 | Davis et al. | 701/120 |
| 2009/0185549 A1* | 7/2009 | Shon et al. | 370/349 |
| 2009/0265744 A1* | 10/2009 | Singh et al. | 725/105 |
| 2010/0002628 A1* | 1/2010 | Anchi et al. | 370/328 |
| 2010/0077141 A1* | 3/2010 | Achler | 711/108 |
| 2010/0135495 A1* | 6/2010 | Chion et al. | 380/273 |
| 2010/0142560 A1* | 6/2010 | Sharivker et al. | 370/475 |
| 2010/0208655 A1* | 8/2010 | Kim et al. | 370/328 |
| 2010/0260114 A1* | 10/2010 | Vermani et al. | 370/329 |
| 2011/0122893 A1* | 5/2011 | Kang et al. | 370/477 |
| 2012/0147902 A1* | 6/2012 | Kim et al. | 370/474 |
| 2012/0263137 A1* | 10/2012 | Walton et al. | 370/329 |
| 2013/0006527 A1* | 1/2013 | Chiayee et al. | 701/483 |
| 2013/0022032 A1* | 1/2013 | Taghavi Nasrabadi et al. | 370/338 |
| 2013/0128808 A1* | 5/2013 | Wentink et al. | 370/328 |
| 2013/0128809 A1* | 5/2013 | Wentink et al. | 370/328 |
| 2014/0029502 A1* | 1/2014 | Hong et al. | 370/312 |

OTHER PUBLICATIONS

International Search Report and Written Opinion—PCT/US2012/063271—ISA/EPO—Feb. 18, 2013.

* cited by examiner

300 ↘

| Field Name | Size in Octets | Field Description |
|---|---|---|
| fc | 2 | frame control |
| dur | 2 | duration/id |
| a1 | 6 | receiver address |
| a2 | 6 | transmitter address |
| a3 | 6 | destination address |
| sc | 2 | sequence control |
| qc | 2 | quality of service control |
| ccmp | 8 | counter-mode/cbc-mac protocol |
| payload | 48 | packet payload |
| mic | 8 | message integrity check |
| fcs | 4 | frame control sequence |
| TOTAL SIZE | 94 | |

| Field Name | Size in Octets | Field Description |
|---|---|---|
| llc/snap | 8 | logical link control/sub-network access protocol |
| ver/ihl | 1 | version/internet header length |
| tos | 1 | type of service |
| tlen | 2 | total length |
| id | 2 | identification |
| flags/fo | 2 | flags/fragment offset |
| ttl | 1 | time to live |
| prot | 1 | protocol |
| check | 2 | checksum |
| sa | 4 | source address |
| da | 4 | destination address |
| sp | 2 | source port |
| dp | 2 | destination port |
| sn | 4 | sequence number |
| an | 4 | acknowledgment number |
| len/flags | 2 | length/flags |
| ws | 2 | window size |
| check | 2 | checksum |
| urg | 2 | urgent |
| TOTAL SIZE | 48 | |

| Field Name | Size in Octets | Field Description |
|---|---|---|
| fc | 2 | frame control |
| dur | 2 | duration/id |
| a1 | 6 | receiver address |
| a2 | 6 | transmitter address |
| a3 | 6 | destination address |
| sc | 2 | sequence control |
| qc | 2 | quality of service control |
| ccmp | 8 | counter-mode/cbc-mac protocol |
| payload | 68 | packet payload |
| mic | 8 | message integrity check |
| fcs | 4 | frame control sequence |
| TOTAL SIZE | 114 | |

| Field Name | Size in Octets | Field Description |
|---|---|---|
| llc/snap | 8 | logical link control/sub-network access protocol |
| ver | 0.5 | version |
| tc | 1 | traffic class |
| fl | 2.5 | flow label |
| len | 2 | length |
| nh | 1 | next header |
| hl | 1 | hop limit |
| sa | 16 | source address |
| da | 16 | destination address |
| sp | 2 | source port |
| dp | 2 | destination port |
| sn | 4 | sequence number |
| an | 4 | acknowledgment number |
| len/flags | 2 | length/flags |
| ws | 2 | window size |
| check | 2 | checksum |
| urg | 2 | urgent |
| TOTAL SIZE | 68 | |

418

452, 454, 456, 458, 460, 462, 464, 466, 468, 470, 472, 474, 476, 478, 480, 482, 484

IPv6 brace: ver, tc, fl, len, nh, hl, sa, da
TCP brace: sp, dp, sn, an, len/flags, ws, check, urg

FIG. 4B

| MPDU Not Compressed | | | MPDU Compressed | |
|---|---|---|---|---|
| Field Name | Size in Octets | | Field Name | Size in Octets |
| fc | 2 | ↔ | fc | 2 |
| dur | 2 | | dur | - |
| a1 | 6 | ↔ | a1 | 6 |
| a2 | 6 | ↔ | a2 | 6 |
| a3 | 6 | | a3 | - |
| sc | 2 | ↔ | sc | 2 |
| qc | 2 | | qc | - |
| ccmp | 8 | ↔ | ccmp | 8 |
| payload | 48 | ↔ | payload | 12 |
| mic | 8 | ↔ | mic | 8 |
| fcs | 4 | ↔ | fcs | 4 |
| TOTAL SIZE | 94 | | TOTAL SIZE | 48 |

FIG. 5A

| Payload Not Compressed | |
|---|---|
| Field Name | Size in Octets |
| llc/snap | 8 |
| ver/ihl | 1 |
| tos | 1 |
| len | 2 |
| id | 2 |
| flags/fo | 2 |
| ttl | 1 |
| prot | 1 |
| check | 2 |
| sa | 4 |
| da | 4 |
| sp | 2 |
| dp | 2 |
| sn | 4 |
| an | 4 |
| len/flags | 2 |
| ws | 2 |
| check | 2 |
| urg | 2 |
| TOTAL SIZE | 48 |

IPv4: llc/snap through da
TCP: sp through urg

| Payload Compressed | |
|---|---|
| Field Name | Size in Octets |
| llc/snap | - |
| ver/ihl | - |
| tos | - |
| len | - |
| id | - |
| flags/fo | - |
| ttl | - |
| prot | - |
| check | 2 |
| sa | - |
| da | - |
| sp | - |
| dp | - |
| sn | 4 |
| an | 4 |
| len/flags | - |
| ws | - |
| check | 2 |
| urg | - |
| TOTAL SIZE | 12 |

FIG. 5B

| MPDU Not Compressed | |
|---|---|
| Field Name | Size in Octets |
| fc | 2 |
| dur | 2 |
| a1 | 6 |
| a2 | 6 |
| a3 | 6 |
| sc | 2 |
| qc | 2 |
| ccmp | 8 |
| payload | 68 |
| mic | 8 |
| fcs | 4 |
| TOTAL SIZE | 114 |

| MPDU Compressed | |
|---|---|
| Field Name | Size in Octets |
| fc | 2 |
| dur | - |
| a1 | 6 |
| a2 | 6 |
| a3 | - |
| sc | 2 |
| qc | - |
| ccmp | 8 |
| payload | 10 |
| mic | 8 |
| fcs | 4 |
| TOTAL SIZE | 46 |

FIG. 6A

Payload Not Compressed

| Field Name | Size in Octets |
|---|---|
| llc/snap | 8 |
| ver | 0.5 |
| tc | 1 |
| fl | 2.5 |
| len | 2 |
| nh | 1 |
| hl | 1 |
| sa | 16 |
| da | 16 |
| sp | 2 |
| dp | 2 |
| sn | 4 |
| an | 4 |
| len/flags | 2 |
| ws | 2 |
| check | 2 |
| urg | 2 |
| TOTAL SIZE | 68 |

IPv6 { ver, tc, fl, len, nh, hl, sa, da }
TCP { sp, dp, sn, an, len/flags, ws, check, urg }

Payload Compressed

| Field Name | Size in Octets |
|---|---|
| llc/snap | - |
| ver | - |
| tc | - |
| fl | - |
| len | - |
| nh | - |
| hl | - |
| sa | - |
| da | - |
| sp | - |
| dp | - |
| sn | 4 |
| an | 4 |
| len/flags | - |
| ws | - |
| check | 2 |
| urg | - |
| TOTAL SIZE | 10 |

FIG. 6B

| | Compressed (Octets) | Not Compressed (Octets) | Compressed (Octets) | Not Compressed (Octets) | Compressed (Octets) | Not Compressed (Octets) | Compressed (Octets) |
|---|---|---|---|---|---|---|---|
| TCP/IPv4: | 18 | 2 ↑ | 12 ↑ | 8 ↑ | 4 | 2 ↑ | 2 |
| TCP/IPv6: | 52 | 8 ↑ | 4 ↑ | 2 ↑ | 2 | | |

FIG. 7

| Set Compression Frame |
|---|
| fc |
| dur |
| a1 |
| a2 |
| a3 |
| sc |
| a3 value |
| qc value |
| compression map |
| compressed parts values |
| fcs |

FIG. 8

| Compression Map: 7 18 2 12 8 4 2 2 |
|---|

FIG. 9

| Set Compression Action Frame | Description |
|---|---|
| fc | |
| dur | |
| a1 | |
| a2 | |
| a3 | |
| sc | |
| category | (compression action) |
| action | (set compression) |
| element id | (a3 and qc value element) |
| length | (8 octets) |
| a3 value | |
| qc value | |
| element id | (payload compression element) |
| length | (8 + 36 = 44 octets) |
| compression map | |
| compressed parts values | |
| fcs | |

| Field Name | Size in Bits |
|---|---|
| len | 4 |
| compressed | 6 |
| not compressed | 6 |
| compressed | 6 |
| ... | ... |
| not compressed | 6 |
| compressed | 6 |
| pad | 2 |
| TOTAL | 96 |

| Field Name | Size in Bits | Value |
|---|---|---|
| len | 4 | 7 |
| compressed | 6 | 18 |
| not compressed | 6 | 2 |
| compressed | 6 | 12 |
| not compressed | 6 | 8 |
| compressed | 6 | 4 |
| not compressed | 6 | 2 |
| compressed | 6 | 2 |
| pad | 2 | |
| TOTAL | 48 | |

FIG. 12B

| Field Name |
|---|
| PHY Header |
| MPDU Delimiter |
| Compression Run-length Encoding |
| MPDU Delimiter |
| MPDU 2 |
| MPDU Delimiter |
| MPDU 3 |
| MPDU Delimiter |
| MPDU 4 |
| MPDU Delimiter |
| MPDU 5 |
| MPDU Delimiter |
| MPDU 6 |
| MPDU Delimiter |
| MPDU 7 |
| MPDU Delimiter |
| MPDU 8 |
| MPDU Delimiter |
| MPDU 9 |
| MPDU Delimiter |
| MPDU 10 |

FIG. 14

SYSTEMS AND METHODS FOR COMPRESSING HEADERS AND PAYLOADS

CROSS REFERENCE TO RELATED APPLICATIONS

This application claims benefit under 35 U.S.C. §119(e) to U.S. Provisional Patent Application No. 61/554,562 entitled "SYSTEMS AND METHODS FOR COMPRESSING HEADERS AND PAYLOADS" filed on Nov. 2, 2011, the disclosure of which is hereby incorporated by reference in its entirety. This application additionally claims benefit under 35 U.S.C. §119(e) to U.S. Provisional Patent Application No. 61/656,403 entitled "SYSTEMS AND METHODS FOR COMPRESSING HEADERS AND PAYLOADS" filed on Jun. 6, 2012, the disclosure of which is hereby incorporated by reference in its entirety.

FIELD

The present application relates generally to wireless communications, and more specifically to systems, methods, and devices for compressing packet headers and payloads.

BACKGROUND

In many telecommunication systems, communications networks are used to exchange messages among several interacting spatially-separated devices. Networks may be classified according to geographic scope, which could be, for example, a metropolitan area, a local area, or a personal area. Such networks would be designated respectively as a wide area network (WAN), metropolitan area network (MAN), local area network (LAN), wireless local area network (WLAN), or personal area network (PAN). Networks also differ according to the switching/routing technique used to interconnect the various network nodes and devices (e.g. circuit switching vs. packet switching), the type of physical media employed for transmission (e.g. wired vs. wireless), and the set of communication protocols used (e.g. Internet protocol suite, SONET (Synchronous Optical Networking), Ethernet, etc.).

Wireless networks are often preferred when the network elements are mobile and thus have dynamic connectivity needs, or if the network architecture is formed in an ad hoc, rather than fixed, topology. Wireless networks employ intangible physical media in an unguided propagation mode using electromagnetic waves in the radio, microwave, infra-red, optical, etc. frequency bands. Wireless networks advantageously facilitate user mobility and rapid field deployment when compared to fixed wired networks.

The devices in a wireless network may transmit or receive information between each other. The information may take the form of packets transmitted from a source device (the transmitting device) to a destination device (the receiving device). Since each packet takes time and energy for the source device to transmit and for the destination device to receive, improved systems, methods, and devices for expediting the transmission and receipt of packets, as well as reducing power consumption, are desired.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section entitled "Detailed Description" one will understand how the features of this invention provide advantages that include reduced packet transmission time and reduced power consumption in a wireless network.

One aspect of this disclosure is a method for wireless communication implemented in a wireless communication device. The method includes compressing a packet in accordance with a compression map. The packet includes a packet header and a packet payload. The compression map includes a run-length encoded data set identifying at least one data field of the packet header and the packet payload to compress. The method further includes transmitting the compressed packet.

Another aspect of this disclosure is a method for wireless communication implemented in a wireless communication device. The method includes receiving a packet comprising a packet header and a packet payload. The method further includes decompressing the packet in accordance with a decompression map. The decompression map includes a run-length encoded data set identifying at least one data field of the packet header and the packet payload to decompress.

In yet another aspect of this disclosure is an apparatus operable in a wireless communication system including a processor and a transmitter. The processor is configured to compress a packet in accordance with a compression map. The packet includes a packet header and a packet payload. The compression map includes a run-length encoded data set identifying at least one data field of the packet header and the packet payload to compress. The transmitter is configured to transmit the compressed packet.

Another aspect of this disclosure is an apparatus operable in a wireless communication system including a receiver and a processor. The receiver is configured to receive a packet comprising a packet header and a packet payload. The processor is configured to decompress the packet in accordance with a decompression map. The decompression map includes a run-length encoded data set identifying at least one data field of the packet header and the packet payload to decompress.

In yet another aspect of this disclosure is an apparatus operable in a wireless communication system comprising: means for compressing a packet in accordance with a compression map, the packet comprising a packet header and a packet payload, the compression map comprising a run-length encoded data set identifying at least one data field of the packet header and the packet payload to compress; and means for transmitting the compressed packet.

Another aspect of this disclosure is an apparatus operable in a wireless communication system comprising: means for receiving a packet comprising a packet header and a packet payload; and means for decompressing the packet in accordance with a decompression map, the decompression map comprising a run-length encoded data set identifying at least one data field of the packet header and the packet payload to decompress.

In yet another aspect of this disclosure is a non-transitory computer readable medium comprising instructions that when executed cause an apparatus to: compress a packet in accordance with a compression map, the packet comprising a packet header and a packet payload, the compression map comprising a run-length encoded data set identifying at least one data field of the packet header and the packet payload to compress; and transmit the compressed packet.

Another aspect of this disclosure is a non-transitory computer readable medium comprising instructions that when executed cause an apparatus to: receive a packet comprising a packet header and a packet payload; and decompress the packet in accordance with a decompression map, the decompression map comprising a run-length encoded data set identifying at least one data field of the packet header and the packet payload to decompress.

The methods, apparatus, and computer program products of the preceding paragraphs can include a combination of one or more of the following features: A packet may be compressed by excluding data of at least one data field identified by the compression map. A packet may be decompressed by determining stored data values for at least one data field identified by a decompression map. A compression map may direct compression of a data field when data of the data field of a first packet is the same as data of a corresponding data field of a second packet. A compression map may direct compression of a data field corresponding to a data field identified in a decompression map stored in a receiver configured to receive the compressed packet. A compression map may not direct compression of a first set of data fields of the packet payload, the first set of data fields comprising at least one checksum data field, a sequence number data field, and an acknowledgment number data field. A compression map may not direct compression of a second set of data fields of the packet header, the second set of data fields comprising a frame control data field, an address 1 data field, an address 2 data field, a sequence control data field, a counter-mode/cbc-mac protocol data field, a message integrity check data field, and a frame control sequence data field. A packet may comprise an aggregated media access control service data unit (A-MSDU), and the packet payload may comprise at least one A-MSDU subframe. It may be signaled or detected in a header of a compressed packet that at least one A-MSDU subframe in a payload of a compressed packet is compressed. It may be signaled or detected in an A-MSDU subframe of a compressed packet that the A-MSDU subframe is compressed. A payload of a compressed packet may comprise a decompression map identifying at least one MSDU subframe to decompress and at least one MSDU subframe not to decompress. A packet may comprise an aggregated media access control protocol data unit (A-MPDU), and the packet payload comprises at least one MPDU. It may be signaled or detected in a header of a compressed packet that at least one MPDU in a payload of the compressed packet is compressed. It may be signaled or detected in a MPDU of a compressed packet that the MPDU is compressed. A payload of a compressed packet may comprise a decompression map, the decompression map identifying at least one MPDU to decompress and at least one MPDU not to decompress and comprising a second run-length encoded data set identifying at least one data field of the header and payload of the compressed packet to decompress. A portion of a packet may be encrypted separately from compressing an unencrypted portion of the packet. A packet may be compressed prior to encrypting of a portion of the packet.

BRIEF DESCRIPTION OF THE DRAWINGS

FIGS. 3A and 3B illustrate an example of a media access control protocol data unit (MPDU) with IPv4 TCP Ack (MPDU IPv4 packet).

FIGS. 4A and 4B illustrate an example of a media access control protocol data unit with IPv6 TCP Ack (MPDU IPv6 packet).

FIGS. 5A and 5B illustrate an example of a compressed MPDU IPv4 packet header and payload in accordance with an exemplary embodiment.

FIGS. 6A and 6B illustrate an example of a compressed MPDU IPv6 packet header and payload in accordance with an exemplary embodiment.

FIG. 7 illustrates run-length encodings of a MPDU IPv4 packet payload compression and a MPDU IPv6 packet payload compression, according to an exemplary embodiment.

FIG. 8 illustrates an exemplary set compression frame in accordance with an embodiment.

FIG. 9 illustrates an exemplary compression map in the form of run-length encoding.

FIG. 10 illustrates an exemplary set compression action frame in accordance with an embodiment.

FIGS. 12A and 12B illustrate contents of example compression run-length encoding fields.

FIG. 14 illustrates an example aggregated MPDU (A-MPDU).

DETAILED DESCRIPTION

Figure 1:
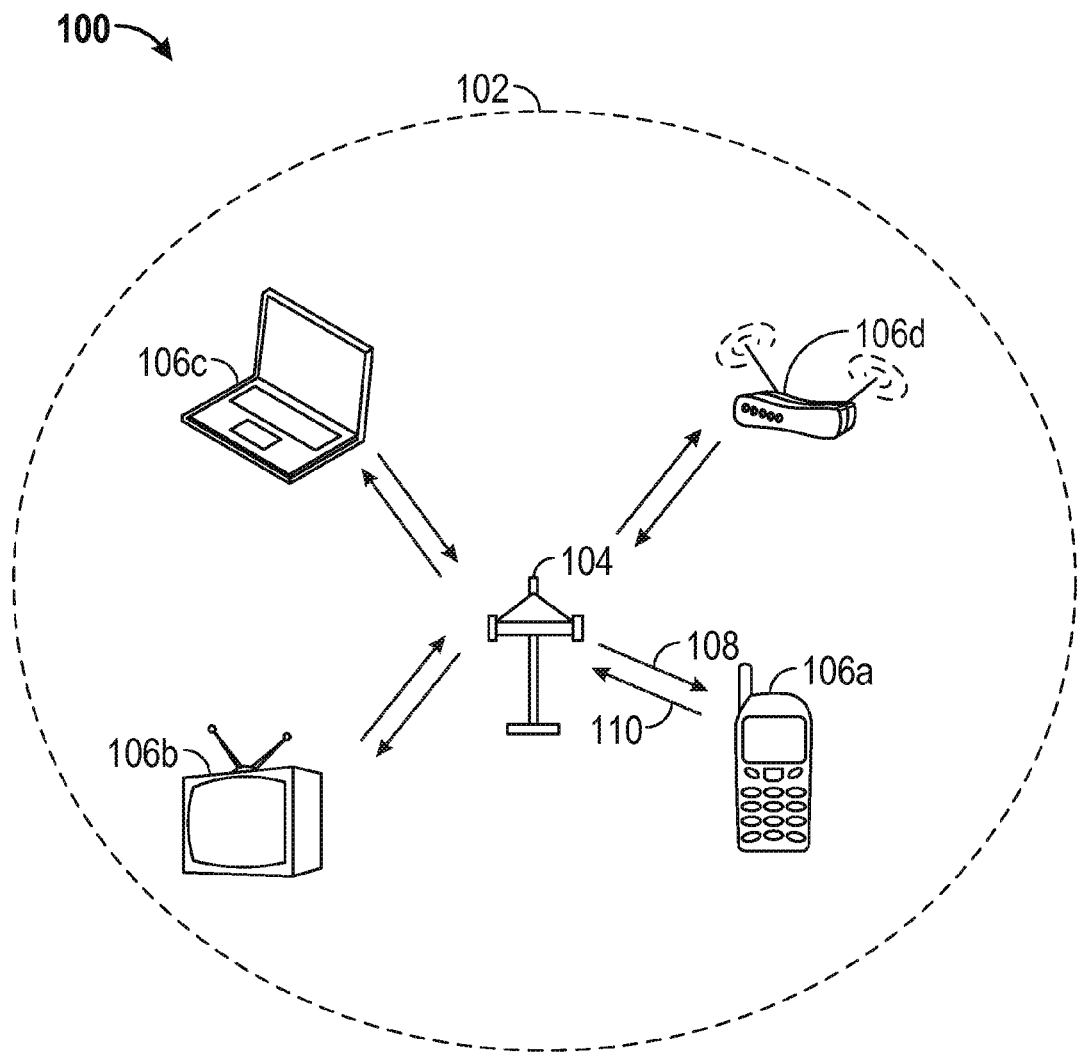
FIG. 1 shows an exemplary wireless communication system in which aspects of the present disclosure may be employed.

The word "exemplary" is used herein to mean "serving as an example, instance, or illustration." Any embodiment described herein as "exemplary" is not necessarily to be construed as preferred or advantageous over other embodiments. Various aspects of the novel systems, apparatuses, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of, or combined with, any other aspect of the invention. For example, an apparatus may be implemented or a method may be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Wireless network technologies may include various types of wireless local area networks (WLANs). A WLAN may be used to interconnect nearby devices together, employing widely used networking protocols. The various aspects described herein may apply to any communication standard, such as WiFi or, more generally, any member of the IEEE 802.11 family of wireless protocols. For example, the various aspects described herein may be used as part of the IEEE 802.11ah protocol, which uses sub-1 GHz bands.

In some aspects, wireless signals in a sub-gigahertz band may be transmitted according to the 802.11ah protocol using orthogonal frequency-division multiplexing (OFDM), direct-sequence spread spectrum (DSSS) communications, a combination of OFDM and DSSS communications, or other schemes. Implementations of the 802.11ah protocol may be used for sensors, metering, and smart grid networks. Advantageously, aspects of certain devices implementing the 802.11ah protocol may consume less power than devices implementing other wireless protocols, and/or may be used to transmit wireless signals across a relatively long range, for example about one kilometer or longer.

In some implementations, a WLAN includes various devices which are the components that access the wireless network. For example, there may be two types of devices: access points ("APs") and clients (also referred to as stations, or "STAs"). In general, an AP may serve as a hub or base station for the WLAN and an STA serves as a user of the WLAN. For example, an STA may be a laptop computer, a personal digital assistant (PDA), a mobile phone, etc. In an example, an STA connects to an AP via a WiFi (e.g., IEEE 802.11 protocol such as 802.11ah) compliant wireless link to obtain general connectivity to the Internet or to other wide area networks. In some implementations an STA may also be used as an AP.

An access point ("AP") may also comprise, be implemented as, or known as a NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, or some other terminology.

A station "STA" may also comprise, be implemented as, or known as an access terminal ("AT"), a subscriber station, a subscriber unit, a mobile station, a remote station, a remote terminal, a user terminal, a user agent, a user device, user equipment, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, or some other suitable processing device connected to a wireless modem. Accordingly, one or more aspects taught herein may be incorporated into a phone (e.g., a cellular phone or smartphone), a computer (e.g., a laptop), a portable communication device, a headset, a portable computing device (e.g., a personal data assistant), an entertainment device (e.g., a music or video device, or a satellite radio), a gaming device or system, a global positioning system device, or any other suitable device that is configured to communicate via a wireless medium.

As discussed above, certain of the devices described herein may implement the 802.11ah standard, for example. Such devices, whether used as an STA or AP or other device, may be used for smart metering or in a smart grid network. Such devices may provide sensor applications or be used in home automation. The devices may instead or in addition be used in a healthcare context, for example for personal healthcare. They may also be used for surveillance, to enable extended-range Internet connectivity (e.g. for use with hotspots), or to implement machine-to-machine communications.

FIG. 1 shows an exemplary wireless communication system 100 in which aspects of the present disclosure may be employed. The wireless communication system 100 may operate pursuant to a wireless standard, for example the 802.11ah standard. The wireless communication system 100 may include an AP 104, which communicates with STAs 106.

A variety of processes and methods may be used for transmissions in the wireless communication system 100 between the AP 104 and the STAs 106. For example, signals may be sent and received between the AP 104 and the STAs 106 in accordance with OFDM/OFDMA techniques. If this is the case, the wireless communication system 100 may be referred to as an OFDM/OFDMA system. Alternatively, signals may be sent and received between the AP 104 and the STAs 106 in accordance with CDMA techniques. If this is the case, the wireless communication system 100 may be referred to as a CDMA system.

A communication link that facilitates transmission from the AP 104 to one or more of the STAs 106 may be referred to as a downlink (DL) 108, and a communication link that facilitates transmission from one or more of the STAs 106 to the AP 104 may be referred to as an uplink (UL) 110. Alternatively, a downlink 108 may be referred to as a forward link or a forward channel, and an uplink 110 may be referred to as a reverse link or a reverse channel.

The AP 104 may act as a base station and provide wireless communication coverage in a basic service area (BSA) 102. The AP 104 along with the STAs 106 associated with the AP 104 and that use the AP 104 for communication may be referred to as a basic service set (BSS). It should be noted that the wireless communication system 100 may not have a central AP 104, but rather may function as a peer-to-peer network between the STAs 106. Accordingly, the functions of the AP 104 described herein may alternatively be performed by one or more of the STAs 106.

Figure 2:
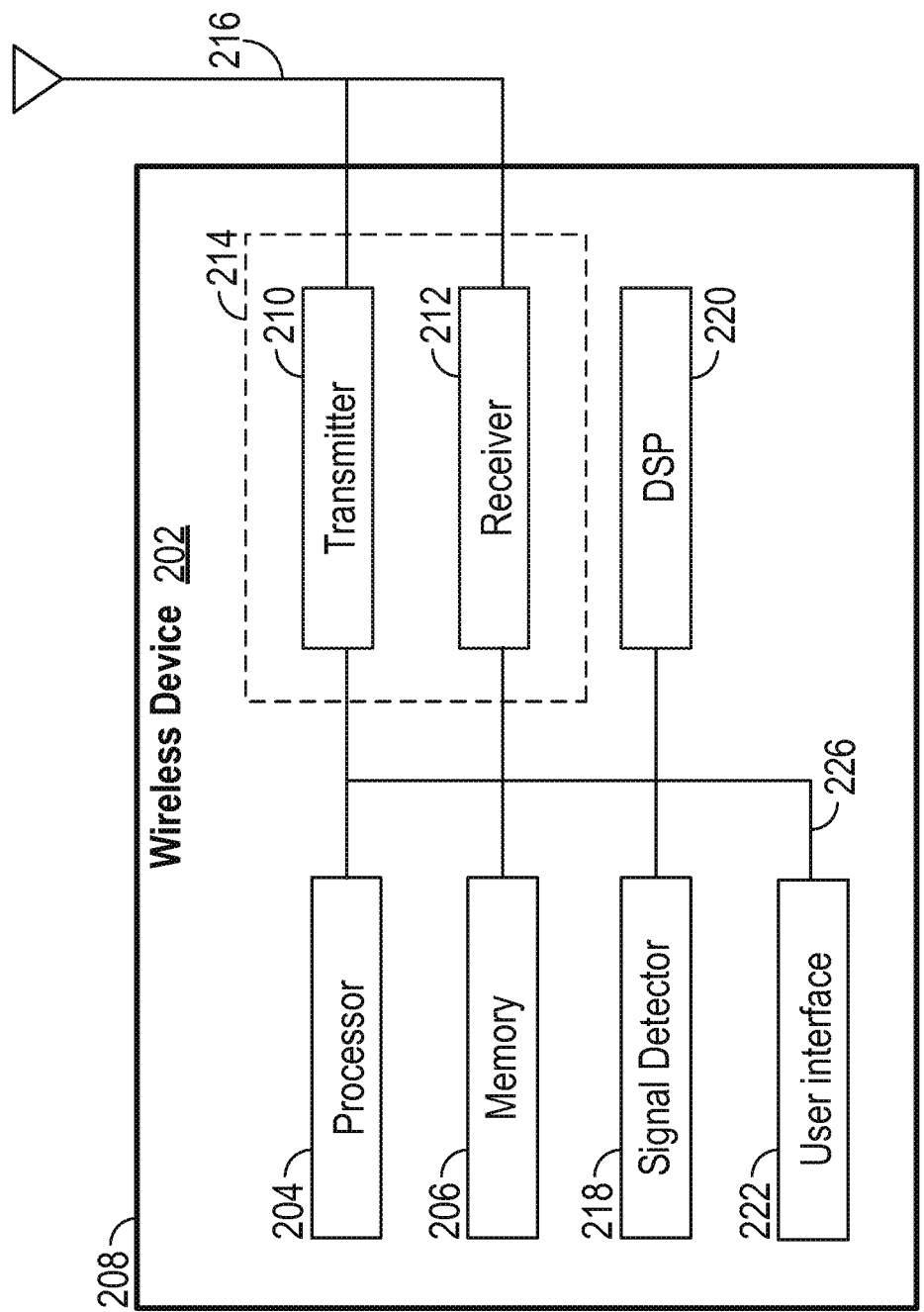
FIG. 2 shows a functional block diagram of an exemplary wireless device that may be employed within the wireless communication system of FIG. 1.

FIG. 2 shows an exemplary functional block diagram of a wireless device 202 that may be employed within the wireless communication system 100 of FIG. 1. The wireless device 202 is an example of a device that may be configured to implement the various methods described herein. For example, the wireless device 202 may comprise the AP 104 or one of the STAs 106.

The wireless device 202 may include a processor 204 which controls operation of the wireless device 202. The processor 204 may also be referred to as a central processing unit (CPU). Memory 206, which may include both read-only memory (ROM) and random access memory (RAM), may provide instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The processor 204 may comprise or be a component of a processing system implemented with one or more processors. The one or more processors may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system may also include machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing system to perform the various functions described herein.

The wireless device 202 may also include a housing 208 that may include a transmitter 210 and/or a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The transmitter 210 may be configured to wirelessly transmit packets, which may include header and payload information as discussed below. For example, the transmitter 210 may be configured to transmit packets generated by the processor 204, discussed above.

The receiver 212 may be configured to wirelessly receive packets and process the packets.

The wireless device 202 may also include a signal detector 218 that may be used in an effort to detect and quantify the level of signals received by the transceiver 214. The signal detector 218 may detect such signals as total energy, energy per subcarrier per symbol, power spectral density and other signals. The wireless device 202 may also include a digital signal processor (DSP) 220 for use in processing signals. The DSP 220 may be configured to generate a packet for transmission. In some aspects, the packet may comprise a physical layer data unit (PPDU).

The wireless device 202 may further comprise a user interface 222 in some aspects. The user interface 222 may comprise a keypad, a microphone, a speaker, and/or a display. The user interface 222 may include any element or component that conveys information to a user of the wireless device 202 and/or receives input from the user.

The various components of the wireless device 202 may be coupled together by a bus system 226. The bus system 226 may include a data bus, for example, as well as a power bus, a control signal bus, and a status signal bus in addition to the data bus. The components of the wireless device 202 may be coupled together or accept or provide inputs to each other using some other mechanism.

Although a number of separate components are illustrated in FIG. 2, one or more of the components may be combined or commonly implemented. For example, the processor 204 may be used to implement not only the functionality described above with respect to the processor 204, but also to implement the functionality described above with respect to the signal detector 218 and/or the DSP 220. Further, each of the components illustrated in FIG. 2 may be implemented using a plurality of separate elements.

For ease of reference, when the wireless device 202 is configured as a transmitting node, it is hereinafter referred to as a wireless device 202t. Similarly, when the wireless device 202 is configured as a receiving node, it is hereinafter referred to as a wireless device 202r. A device in the wireless communication system 100 may implement only functionality of a transmitting node, only functionality of a receiving node, or functionality of both a transmitting node and a receive node.

As discussed above, the wireless device 202 may comprise an AP 104 or an STA 106, and may be used to transmit and/or receive data.

Described herein are systems, methods, and devices for reducing the amount of header and payload information transmitted from a source device, such as the wireless device 202t, to a destination device, such as the wireless device 202r. Certain aspects are described herein with respect to media access control (MAC) headers and payloads. However, the aspects described are not limited to MAC headers and can equally be applied to other appropriate types of headers and packets.

FIG. 3A illustrates an example of a media access control protocol data unit (MPDU) with IPv4 TCP Ack packet (MPDU IPv4 packet) 300, includes a 3-address MAC header using counter-mode with cipher block chaining message authentication code protocol (CCMP) encryption. As shown, the MPDU IPv4 packet 300 includes 11 different fields: a frame control (fc) field 302, a duration/identification (dur) field 304, a receiver address or address 1 (a1) field 306, a transmitter address or address 2 (a2) field 308, a destination address or address 3 (a3) field 310, a sequence control (sc) field 312, a quality of service (QoS) control (qc) field 314, a counter-mode/cbc-mac protocol (ccmp) field 316, a packet payload (payload) field 318, a message integrity check (mic) field 320, and a frame control sequence (fcs) field 322. FIG. 3A further indicates the size in octets of each of the fields 302-322. Summing the size of all of the fields gives the overall size of the MPDU IPv4 packet 300, which is 94 octets. Although not noted in FIG. 3A, the frame control field 302 may further include a frame type field and a frame subtype field, among other fields.

FIG. 3B illustrates an example of the fields that may be included in the payload field 318 of the MPDU IPv4 packet 300. As shown, the payload field 318 includes 19 different fields: a logical link control (llc)/sub-network access protocol (snap) field 352, a version (ver)/internet header length (ihl) field 354, a type of service (tos) field 356, a total length (tlen) field 358, an identification (id) field 360, a flags/fragment offset (fo) field 362, a time to live (ttl) field 364, a protocol (prot) field 366, a checksum (check) field 368, a source address (sa) field 370, a destination address (da) field 372, a source port (sp) field 374, destination port (dp) field 376, a sequence number (sn) field 378, an acknowledgement number (an) field 380, a length (len)/flags field 382, a window size (ws) field 384, a checksum (check) 386, and an urgent (urg)

field 388. FIG. 3B further indicates that fields 352-372 comprise the IPv4 portion of the payload field 318 while fields 374-388 comprise the TCP portion of the payload field 318. Additionally, FIG. 3B indicates the size in octets of each of the fields 352-388. Summing the size of all of the fields gives the overall size of the payload field 318, which is 48 octets.

Systems and methods for processing MAC headers and payloads of reduced size (compressed MAC headers and payloads) are described herein. The use of such compressed MAC headers and payloads permit less data to be transmitted overall. Less transmission of data can increase the speed with which data is transmitted, reduce the use of bandwidth by a transmitter, and reduce the power needed for transmission as fewer resources are used to transmit less data.

Compression of MAC headers or payloads may be performed by removing or modifying certain fields of the MAC header or payload. The compressed MAC header or payload may then be sent from the wireless device 202t to the wireless device 202r. Removal or modification of the fields may be based on the information to be communicated to the wireless device 202r. For example, the wireless device 202r may not use information in each field of the MPDU IPv4 packet 300 to receive and process the packet since some information may be redundant or superfluous to the wireless device 202r. In some cases, the receiver may already have some information stored in memory that may have been transmitted in the MPDU IPv4 packet 300. Further, in one case, the wireless device 202r may have received identical, matching, or corresponding information in one or more previously received packets from the wireless device 202t, such as in the MAC header and payload of the previous packet. In another case, the wireless device 202r may have such information pre-programmed, such as at the time of manufacture or through communication with another device.

In some embodiments, the wireless device 202t may signal whether a packet has been compressed by placing a specific value in the frame type field or frame subtype field of the frame control field 302. The wireless device 202r may determine whether the MAC header or packet is compressed based on the value of the frame type field or frame subtype field. In yet other embodiments, compression of a header and packet may be signaled using other fields or methods.

FIG. 4A illustrates an example of a MPDU with IPv6 TCP Ack packet (MPDU IPv6 packet) 400, includes a 3-address MAC header using counter-mode with cipher block chaining message authentication code protocol (CCMP) encryption. As shown, the MPDU IPv6 packet 400 includes 11 different fields: a frame control (fc) field 402, a duration/identification (dur) field 404, a receiver address or address 1 (a1) field 406, a transmitter address or address 2 (a2) field 408, a destination address or address 3 (a3) field 410, a sequence control (sc) field 412, a quality of service (QoS) control (qc) field 414, a counter-mode/cbc-mac protocol (ccmp) field 416, a packet payload (payload) field 418, a message integrity check (mic) field 420, and a frame control sequence (fcs) field 422. FIG. 4A further indicates the size in octets of each of the fields 402-422. Summing the size of all of the fields gives the overall size of the MPDU IPv6 packet 400, which is 114 octets. Although not noted in FIG. 4A, the frame control field 402 may further comprise a frame type field and a frame subtype field, among other fields.

FIG. 4B illustrates an example of the fields that may be included in the payload field 418 of the MPDU IPv6 packet 400. As shown, the payload field 418 includes 17 different fields: a logical link control (llc)/sub-network access protocol (snap) field 452, a version (ver) field 454, a traffic class (tc) field 456, a flow label (fl) field 458, a length (len) field 460, a next header (nh) field 462, a hop limit (hl) field 464, a source address (sa) field 466, a destination address (da) field 468, a source port (sp) field 470, a destination port (dp) field 472, a sequence number (sn) field 474, an acknowledgement number (an) field 476, a length (len)/flags field 478, a window size (ws) field 480, a checksum (check) field 482, and an urgent (urg) field 484. FIG. 4B further indicates that fields 452-468 comprise the IPv6 portion of the payload field 418 while fields 370-384 comprise the TCP portion of the payload field 418. Additionally, FIG. 4B indicates the size in octets of each of the fields 452-484. Summing the value of all of the field sizes gives the overall size of the payload field 418, which is 68 octets.

Compression of MAC headers or payloads may be performed by removing or modifying certain fields of the MAC header or payload. The compressed MAC header or payload may then be sent from the wireless device 202t to the wireless device 202r. Removal or modification of the fields may be based on the information to be communicated to the wireless device 202r. For example, the wireless device 202r may not use information in each field of the MPDU IPv6 packet 400 to receive and process the packet since some information may be redundant or superfluous to the wireless device 202r. In some cases the receiver may already have some information stored in memory that may have been transmitted in the MPDU IPv6 packet 400. Further, in one case, the wireless device 202r may have received identical, matching, or corresponding information in one or more previously received packets from the wireless device 202t, such as in the MAC header and payload of the previous packet. In another case, the wireless device 202r may have such information pre-programmed, such as at the time of manufacture or through communication with another device.

In some embodiments, the wireless device 202t may signal whether a packet has been compressed by placing a specific value in the frame type field or frame subtype field of the frame control field 402. The wireless device 202r may determine the whether the MAC header or packet is compressed based on the value of the frame type field or frame subtype field. In yet other embodiments, compression of a header and packet may be signaled using other fields or methods.

FIG. 5A illustrates an example of a compressed MPDU IPv4 packet header and payload in accordance with an exemplary embodiment. The duration/identification (dur) field, address 3 (a3) field, quality of service control (qc) field, and payload field are compressed in whole or in part. In some aspects, the duration/identification (dur) field, address 3 (a3) field, and quality of service control (qc) field or data contents of those fields are completely removed by compression and may not be transmitted by the wireless device 202t. The payload field is compressed in part so that 12 octets of the original 48 octets may be transmitted by the wireless device 202t. The total size in octets of the transmitted compressed MPDU IPv4 packet equals 48 octets. In some aspects, compression may signify that a data field of a packet was removed, suppressed, or erased so that the data field may not be transmitted by the wireless device 202t. In addition, compression may signify that data contents of one or more fields of a packet are excluded from inclusion in the packet or a compressed packet obtained by compressing the packet. The compression process may further be reversed by decompression and the original packet may be obtained from the compressed packet, for example, using stored data values to populate the compressed fields.

FIG. 5B further details payload fields of a MPDU IPv4 packet may be compressed in accordance with an exemplary embodiment. After compression, only the checksum (check)

field, sequence number (sn) field, acknowledgement number (an) field, and checksum (check) field or data contents of those fields of the TCP portion of the payload may be included and transmitted by the wireless device 202*t*. The total size in octets of the transmitted compressed MPDU IPv4 packet payload equals 12 octets. The compression process may further be reversed by decompression and the original packet may be obtained from the compressed packet, for example, using stored data values to populate the compressed fields.

FIG. 6A illustrates an example of a compressed MPDU IPv6 packet header and payload in accordance with an exemplary embodiment. The duration/identification (dur) field, address 3 (a3) field, quality of service control (qc) field, and payload field are compressed in whole or in part. In some aspects, the duration/identification (dur) field, address 3 (a3) field, and quality of service control (qc) field or data contents of those fields are completely removed by compression and may not be transmitted by the wireless device 202*t*. The payload field is compressed in part so that 10 octets of the original 68 octets may be transmitted by the wireless device 202*t*. The total size in octets of the transmitted compressed MPDU IPv6 packet equals 46 octets. In some aspects, compression may signify that a data field of a packet was removed, suppressed, or erased so that the data field may not be transmitted by the wireless device 202*t*. In addition, compression may signify that data contents of one or more fields of a packet are excluded from inclusion in the packet or a compressed packet obtained by compressing the packet. The compression process may further be reversed by decompression and the original packet may be obtained from the compressed packet, for example, using stored data values to populate the compressed fields.

FIG. 6B further details payload fields of a MPDU IPv6 packet may be compressed in accordance with an exemplary embodiment. After compression, only the sequence number (sn) field, acknowledgement number (an) field, and checksum (check) field or data contents of those fields of the TCP portion of the payload may be included and transmitted by the wireless device 202*t*. The total size in octets of the transmitted compressed MPDU IPv6 packet payload equals 10 octets. The compression process may further be reversed by decompression and the original packet may be obtained from the compressed packet, for example, using stored data values to populate the compressed fields.

FIG. 7 illustrates run-length encodings of a MPDU IPv4 packet payload compression and a MPDU IPv6 packet payload compression, according to an exemplary embodiment. Run-length encoding may be a form of data compression where runs of data are stored as a data value and count. In some aspects, the payload compression run-length encoding is expressed in terms of a data set that includes a number of consecutive octets that are alternately compressed and not compressed. Although examples such as FIG. 7 in this disclosure are described in terms of compressed or not compressed, the coding may apply and be understood in terms of decompression, such as to decompress or not to decompress. Accordingly, compression maps and decompression maps may be used to perform compression or decompression, depending on the process performed by a device.

The example MPDU IPv4 packet payload compression begins with compressing the first 18 octets of the MPDU IPv4 packet payload. Second, the following 2 octets of the MPDU IPv4 packet payload are not compressed. Third, the next 12 octets of the MPDU IPv4 packet payload are compressed. Fourth, the following 8 octets of the MPDU IPv4 packet payload are not compressed. Fifth, the next 4 octets of the MPDU IPv4 packet payload are compressed. Sixth, the following 2 octets of the MPDU IPv4 packet payload are not compressed. Seventh, the next 2 octets of the MPDU IPv4 packet payload are compressed. In some aspects, after the final compressed 2 octets, any number of additional payload octets that are not compressed may follow.

The example MPDU IPv6 packet payload compression begins with compressing the first 52 octets of the MPDU IPv6 packet payload. Second, the following 8 octets of the MPDU IPv6 packet payload are not compressed. Third, the next 4 octets of the MPDU IPv6 packet payload are compressed. Fourth, the following 2 octets of the MPDU IPv6 packet payload are not compressed. Fifth, the next 2 octets of the MPDU IPv6 packet payload are compressed. In some embodiments, after the final compressed 2 octets, any number of additional payload octets that are not compressed may follow.

FIG. 8 illustrates an exemplary set compression frame in accordance with an embodiment. A set compression frame may also be known as a management frame or a management action frame. The compressed parts of a packet payload and values of compressed parts may be programmed at a wireless device 202*r* through a set compression frame as shown in FIG. 8. The MPDU packet payload values may be programmed with the values of the compressed fields of an initial, example, or representative MPDU packet header.

In FIG. 8, the frame control (fc) field, duration/identification (dur) field, address 1 (a1) field, address 2 (a2) field, address 3 (a3) field, sequence control (sc) field, and frame control sequence (fcs) field may be the MPDU packet header fields of a management frame. The a3 value field may specify the value of the address 3 field of the compressed MPDU packet header. The qc value field may specify the value of the quality of service control (qc) field of the compressed MPDU packet header. The compression map field may specify which fields of the MPDU payload are compressed and not compressed. In some embodiments, the formatting of the compression map field may be a run-length encoded data set as shown in FIG. 7. In yet other embodiments, the compression map field may be formatted or encoded using another approach. The compressed parts values field may specify the values of the compressed parts of the MPDU packet payload. The length of the compressed parts values field may equal the total of the compressed parts or data contents from the compression map field. In the example discussed next in FIG. 9, the total length of the compressed parts values field is 36 octets.

FIG. 9 illustrates an exemplary compression map in the form of a run-length encoded data set. The compression map shown in FIG. 9 corresponds in part to the MPDU IPv4 packet payload compression shown in FIG. 7. In some aspects, a compression map may refer to a data set identifying one or more data fields of a packet to compress. Although the example of FIG. 9 is described in terms of compressed and not compressed parts for a compression map, the coding scheme may apply also and be used with a decompression map, which may include a run-length encoded data set identifying one or more data fields of the packet to decompress or not decompress. Moreover, although compression maps may be used as examples throughout in this disclosure, the same or similar principles may apply to decompression maps, which may be compression maps used by the wireless device 202*r* to determine which fields of a packet to decompress or not decompress.

In FIG. 9, the first value signifies the total number of compressed or not compressed parts to follow, which in this instance is 7 compressed or not compressed parts. The next value, 18, signifies the number of first compressed octets of the MPDU IPv4 packet payload. The following 2 value signifies that the following 2 octets of the MPDU IPv4 packet payload are not compressed. The next 12 value signifies that the next 12 octets of the MPDU IPv4 packet payload are compressed. The following 8 value signifies that the following 8 octets of the MPDU IPv4 packet payload are not compressed. The next 4 value signifies that the next 4 octets of the MPDU IPv4 packet payload are compressed. The following 2 value signifies that the following 2 octets of the MPDU IPv4 packet payload are not compressed. The next 2 value signifies that the next 2 octets of the MPDU IPv4 packet payload are compressed.

In some aspects, each value in the compression map may be one octet in length, meaning that the compressed parts or not compressed parts of the compression map may have a maximum length of 255 octets. Accordingly, the first octet of the compression map may have a maximum of 255 parts that may be specified.

FIG. 10 illustrates an exemplary set compression action frame that may be used to program a wireless device 202r. As shown in FIG. 10, the compression map field and compressed parts values field may be included in an information element before being included in a set compression frame. Consequently, an element identifier field and a length field may be added to the set compression frame, and the length subfield of the compression map field may be omitted.

In FIG. 10, the frame control (fc) field, duration/identification (dur) field, address 1 (a1) field, address 2 (a2) field, address 3 (a3) field, sequence control (sc) field, and frame control sequence (fcs) field may be the MPDU packet header fields of a management frame. The category field and action field may specify the value for compression action and set compression, respectively. The first element id field may specify the value of the address 3 field and quality of service control (qc) field of the compressed MPDU packet header. The first length field in this case may be 8 octets. The a3 value field may specify the value of the address 3 field of the compressed MPDU packet header. The qc value field may specify the value of the quality of service control (qc) field of the compressed MPDU packet header.

Further, the second element id field may specify the compression map and the compressed parts values. The second length field in this case may be 44 octets. The compression map field may specify which fields of the MPDU payload are compressed and not compressed. In some embodiments, the formatting of the compression map field may be a run-length encoded data set as shown in FIG. 9. In yet other embodiments, the compression map field may be formatted or encoded using another encoding or approach. The compressed parts values field may specify the values of the compressed parts or data contents of one or more fields of the MPDU packet payload before compression.

Figure 11:
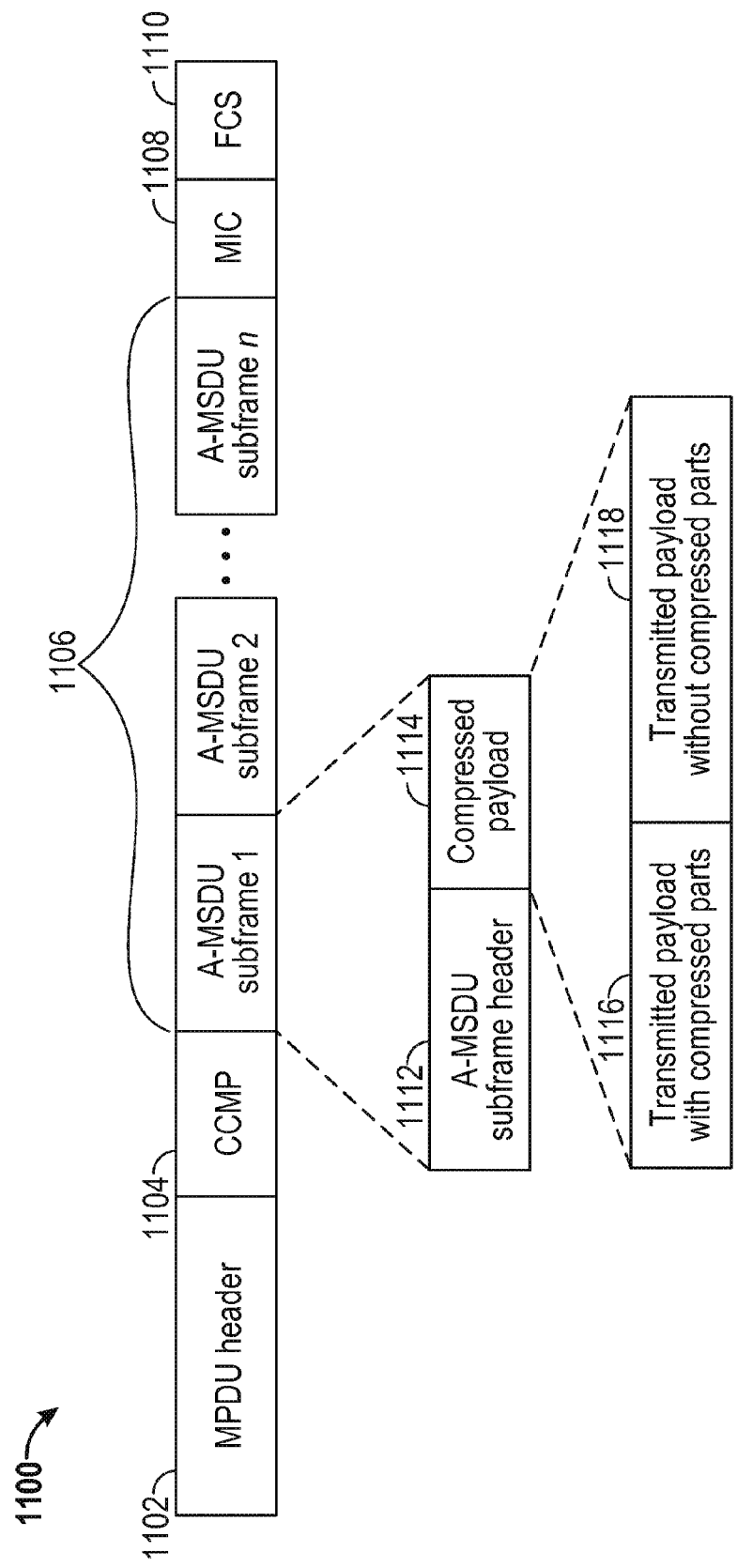
FIG. 11 illustrates an example MPDU that contains an aggregated media access control service data unit (A-MSDU).

FIG. 11 illustrates an example MPDU 1100 that contains an aggregated media access control service data unit (A-MSDU). The MPDU 1100 includes a MPDU header field 1102, a counter-mode/cbc-mac protocol (CCMP) field 1104, n number of A-MSDU subframe fields 1106, a message integrity check (MIC) field 1108, and a frame control sequence (FCS) field 1110. Each A-MSDU subframe of the n A-MSDU subframes includes an A-MSDU subframe header field, such as A-MSDU subframe header field 1112, and a compressed payload field, such as compressed payload field 1114. Further, each compressed payload field, such as compressed payload field 1114, may include a transmitted payload with compressed parts portion (e.g., transmitted payload with compressed parts 1116) and without compressed parts portion (e.g., transmitted payload without compressed parts 1118).

Since each of the n A-MSDU subframes of the MPDU 1100 may be compressed in accordance with the teachings of this disclosure, the teachings of this disclosure may enable compression of the MPDU 1100 that contains the A-MSDU as well. Additionally, the parts for each A-MSDU subframe in the MPDU 1100 that are not compressed may vary per A-MSDU subframe, providing additional compression and data transmission flexibility.

In some aspects, the MPDU header 1102 may indicate that the MPDU 1100 contains an A-MSDU. Further, the MPDU header 1102 may indicate that the MPDU 1100 is a protected frame so that, for example, the n A-MSDU subframe fields 1106 and the MIC field 1108 may be encrypted. In some aspects, the CCMP field 1104 or MIC 1108 field may be excluded from the MPDU 1100.

The compressed payload 1114 may include an individual MSDU, and the transmitted payload with compressed parts 1116 of the compressed payload 1114 may include a compressed portion of the individual MSDU. In one example, the transmitted payload with compressed parts 1116 may include a run-length encoded data set for an IPv4 TCP Ack packet payload compression as discussed in this disclosure (e.g., 18 octets compressed, 2 octets transmitted, 12 octets compresses, 8 octets transmitted, 4 octets compressed, 2 octets transmitted, 2 octets compressed).

In one aspect, the MPDU header 1102 may include a compression map and/or compressed parts values for compression or decompression of one or more of the n A-MSDU subframes included in the MPDU 1100. The MPDU header 1102 may also contain an indication of which A-MSDU subframes are compressed. A transmitting device, such as wireless device 202t, may use the compression map and/or compressed parts values in the MPDU header 1102 to compress the one or more n A-MSDU subframes. A receiving device, such as wireless device 202r, may use the compression map and/or compressed parts values in the MPDU header 1102 to decompress the one or more n A-MSDU subframes.

In one aspect, a compression bit may be added to an A-MSDU subframe header, such as A-MSDU subframe header 1112. The compression bit may indicate that the A-MSDU subframe is compressed or not compressed. A transmitting device, such as wireless device 202t, may use the compression bit to determine whether to compress the A-MSDU subframe. A receiving device, such as wireless device 202r, may use the compression bit to determine whether to decompress the A-MSDU subframe.

In some aspects, one or more MPDU, such as MPDU 1100, may be aggregated to produce an aggregated MPDU (A-MPDU). Since the MPDU frames of an A-MPDU may be compressed in accordance with the teachings of this disclosure, the teachings of this disclosure may enable compression of the A-MPDU that contains compressed MPDU frames.

FIG. 12A illustrates contents of an example compression run-length encoding field 1200. The compression run-length encoding field 1200 may be a compression map include a length (len) field 1202, a compress field 1204, a transmit field 1206, a series of repeating compressed and not compressed fields, and a pad field 1208. The length field 1202 may be 4 bits in size, the compressed and not compressed fields may be 6 bits in size, and the pad field may be 2 bits in size. Accordingly, the total size of the compression run-length encoding field 1200 may be 96 bits or 12 octets as indicated at total 1210.

FIG. 12B illustrates contents of an example compression run-length encoding field 1250 for an IPv4 TCP Ack packet. The compression run-length encoding field 1250 may be a compression map and include a length (len) field 1252, a compressed field 1254, a not compressed field 1256, a series of repeating compressed and not compressed fields, and a pad field 1258. The length field 1252 may be 4 bits in size, the compressed and not compressed fields may be 6 bits in size, and the pad field may be 2 bits in size. The compression run-length encoding field 1250 may store the compression run-length encoding for the IPv4 TPC Ack packet as follows: the length field 1252 stores the value 7, the compressed field 1254 stores the value 18, the not compressed field 1256 stores the value 2, the following compressed and not compressed fields store the values 12, 8, 4, 2, 2, as shown in FIG. 12B. Accordingly, the total size of the compression run-length encoding field 1250 may be 48 bits or 6 octets as indicated at total 1260, and 12 octets may be not compressed and 36 octets may be compressed.

Figure 13:
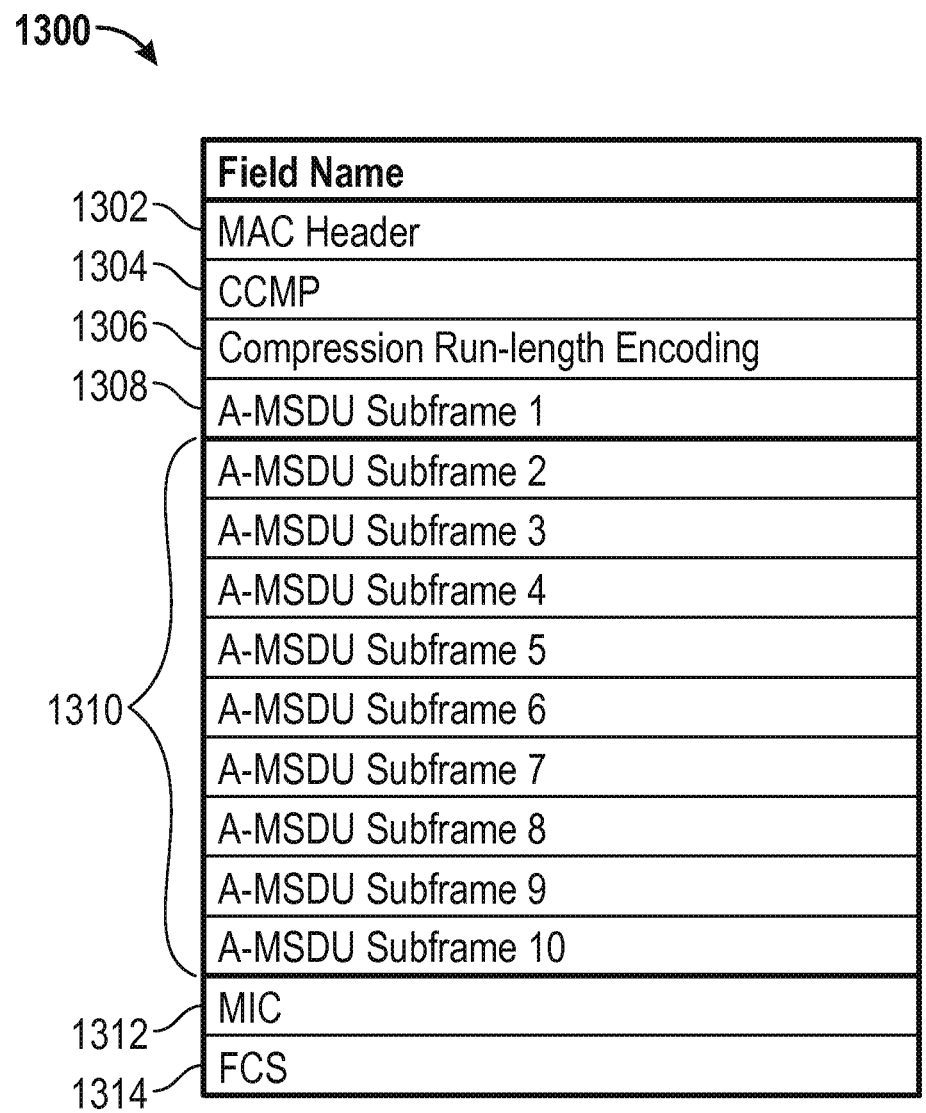
FIG. 13 illustrates another example MPDU that contains an A-MSDU.

FIG. 13 illustrates another example MPDU 1300 that contains an A-MSDU. The MPDU 1300 includes a MPDU header field (MAC header) 1302, a counter-mode/cbc-mac protocol (CCMP) field 1304, a compression run-length encoding field 1306, an A-MSDU subframe 1 field 1308, nine other A-MSDU subframe fields 1310, a message integrity check (MIC) field 1312, and a frame control sequence (FCS) field 1314. The MPDU header field 1302, the CCMP field 1304, the MIC field 1312, and the FCS field 1314 may serve similar functions as the MPDU header field 1102, the CCMP field 1104, the MIC field 1108, and the FCS field 1110, respectively, of FIG. 11.

The compression run-length encoding field 1306 may include data such as the values of the compression run-length encoding fields 1200 or 1250 of FIGS. 12A and 12B. Further, the fields of the compression run-length encoding field 1306 may correspond to the fields of the A-MSDU subframe 1 field 1308 such that the compression run-length encoding field 1306 and the A-MSDU subframe 1 field 1308 in combination indicate which fields of the nine other A-MSDU subframe fields 1310 may be compressed. For example, the A-MSDU subframe 1 field 1308 may include a payload that is not compressed. The nine other A-MSDU subframes fields 1310 may include a compressed payload. Using the compression run-length encoding field 1306 and the A-MSDU subframe 1 field 1308, a wireless device may determine the data contents of the compressed fields for the nine other A-MSDU subframes fields 1310.

Advantageously, given this design, the MPDU 1300 may include information necessary to determine a compression map and/or compressed parts values, so the wireless device 202t may compress the MPDU 1300 or the wireless device 202r may decompress the MPDU 1300.

In some aspects, one or more MPDU, such as MPDU 1300, may be aggregated to produce an A-MPDU. Since the MPDU frames of an A-MPDU may be compressed in accordance with the teachings of this disclosure, the teachings of this disclosure may enable compression of the A-MPDU that contains the compressed MPDU frames.

FIG. 14 illustrates an example A-MPDU 1400. The A-MPDU 1400 may include a physical (PHY) header field 1402, a MPDU delimiter 1404, a compression run-length encoding field 1406, a second MPDU delimiter, a MPDU 2 field 1408, a third MPDU delimiter, a MPDU 3 field 1410, and a series of additional MPDU delimiters and MPDUs.

The compression run-length encoding field 1406 may include data such as the values of the compression run-length encoding fields 1200 or 1250 of FIGS. 12A and 12B. Further, the fields of the compression run-length encoding field 1406 may correspond to the fields of the MPDU 2 field 1408 such that the compression run-length encoding field 1406 and the MPDU 2 field 1408 in combination indicate which fields of the eight other MPDU fields, such as MPDU 3 field 1410, may be compressed. For example, the MPDU 2 field 1408 may include a payload that is not compressed. The eight other MPDU fields, including MPDU 3 field 1410, may include a compressed payload. Using the compression run-length encoding field 1406 and the MPDU 2 field 1408, a wireless device may determine the data contents of the compressed fields for the eight other MPDU fields.

Advantageously, given this design, the A-MPDU 1400 may include information necessary to determine a compression map and/or compressed parts values, so the wireless device 202t may compress the A-MPDU 1400 or the wireless device 202r may decompress the A-MPDU 1400.

Figure 15:
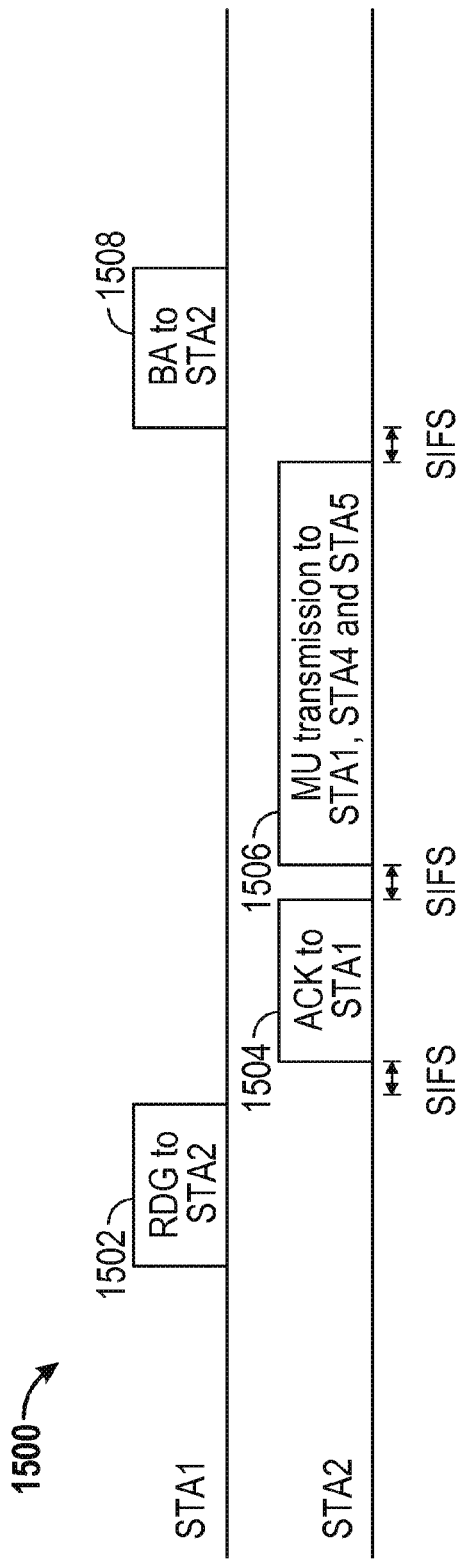
FIG. 15 illustrates example communications in a wireless communication system.

FIG. 15 illustrates example communications 1500 in a wireless communication system. The communications 1500 may be by a STA1 and a STA2. The top line illustrates communications by the STA1, and the bottom line illustrates communications by the STA2. Time increases horizontally across the page to the right.

At block 1502, the STA1 transmits a reverse direction grant (RDG) to STA2. The reverse direction grant may grant the STA2 the opportunity to transmit data with a certain period of time. Further, the reverse direction grant may mean that the MPDU or MPDUs transmitted may have a RDG/More PPDU subfield equal to 1.

A short interface space (SIFS) time later at block 1504, the STA2 may transmit an acknowledgement (ACK) to STA1. A second SIFS time later at block 1506, the STA2 may transmit a multiple user (MU) transmission to STA1, STA4, and STA5. The transmitted MPDU or MPDUs to STA1 may carry an implicit block acknowledgment request (BAR) acknowledgment policy and the RDG/More PPDU subfield may equal to 1. The MPDU or MPDUs to STA4 and STA5 may carry a block acknowledgment policy.

Figure 16:
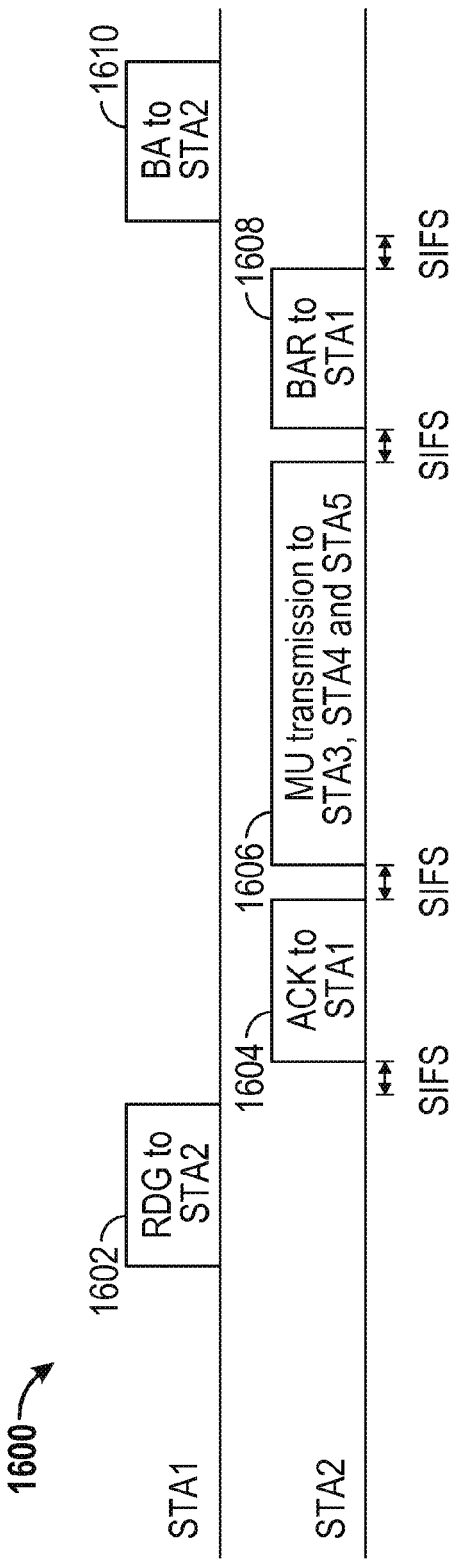
FIG. 16 illustrates example communications in a wireless communication system.

FIG. 16 illustrates example communications 1600 in a wireless communication system. The communications 1600 may be by a STA1 and a STA2. The top line illustrates communications by the STA1, and the bottom line illustrates communications by the STA2. Time increases horizontally across the page to the right.

At block 1602, the STA1 transmits a reverse direction grant to STA2. The reverse direction grant may grant the STA2 the opportunity to transmit data with a certain period of time. Further, the reverse direction grant may mean that the MPDU or MPDUs transmitted may have a RDG/More PPDU subfield equal to 1.

A SIFS time later at block 1604, the STA2 may transmit an acknowledgement to STA1. A second SIFS time later at block 1606, the STA2 may transmit a multiple user transmission to STA3, STA4, and STA5. The MPDU or MPDUs to STA3, STA4, and STA5 may carry a block acknowledgment acknowledgment policy. A third SIFS time later at block 1608, the STA2 may transmit a block acknowledgment request to STA1. A fourth SIFS time later at block 1610, the STA1 may transmit a block acknowledgment in response to STA2.

Figure 17:
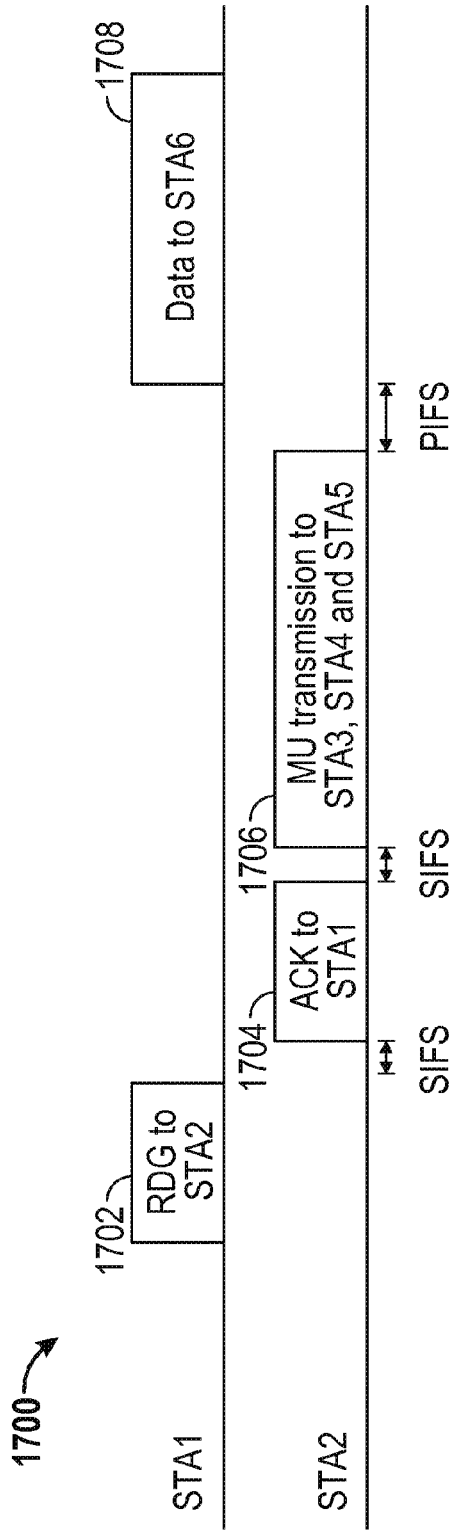
FIG. 17 illustrates example communications in a wireless communication system.

FIG. 17 illustrates example communications 1700 in a wireless communication system. The communications 1700 may be by a STA1 and a STA2. The top line illustrates communications by the STA1, and the bottom line illustrates communications by the STA2. Time increases horizontally across the page to the right.

At block 1702, the STA1 transmits a reverse direction grant to STA2. The reverse direction grant may grant the STA2 the opportunity to transmit data with a certain period of time. Further, the reverse direction grant may mean that the MPDU or MPDUs transmitted may have a RDG/More PPDU subfield equal to 1.

A SIFS time later at block 1704, the STA2 may transmit an acknowledgement to STA1. A second SIFS time later at block 1706, the STA2 may transmit a multiple user transmission to STA3, STA4, and STA5. The MPDU or MPDUs to STA3, STA4, and STA5 may carry a block acknowledgment acknowledgment policy. A PCF interframe space (PIFS) time later at block 1708, the STA 1 may transmit data to STAG.

Figure 18:
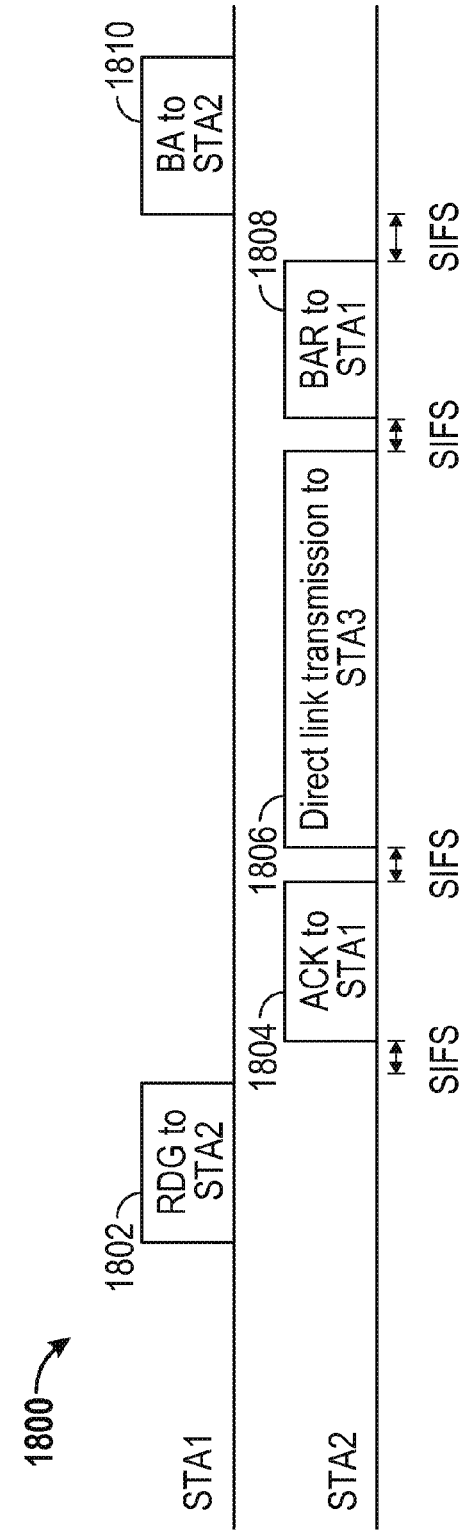
FIG. 18 illustrates example communications in a wireless communication system.

FIG. 18 illustrates example communications 1800 in a wireless communication system. The communications 1800 may be by a STA1 and a STA2. The top line illustrates communications by the STA1, and the bottom line illustrates communications by the STA2. Time increases horizontally across the page to the right.

At block 1802, the STA1 transmits a reverse direction grant to STA2. The reverse direction grant may grant the STA2 the opportunity to transmit data with a certain period of time. Further, the reverse direction grant may mean that the MPDU or MPDUs transmitted may have a RDG/More PPDU subfield equal to 1.

A SIFS time later at block 1804, the STA2 may transmit an acknowledgement to STA1. A second SIFS time later at block 1806, the STA2 may transmit via a direct link transmission to STA3 (e.g., STA2 and STA3 may be connected via a TDLS direct link). The MPDU or MPDUs to STA3 may carry a block acknowledgment policy. A third SIFS time later at block 1808, the STA2 may transmit a block acknowledgment request to STA1. A fourth SIFS time later at block 1810, the STA1 may transmit a block acknowledgment in response to STA2.

Figure 19:
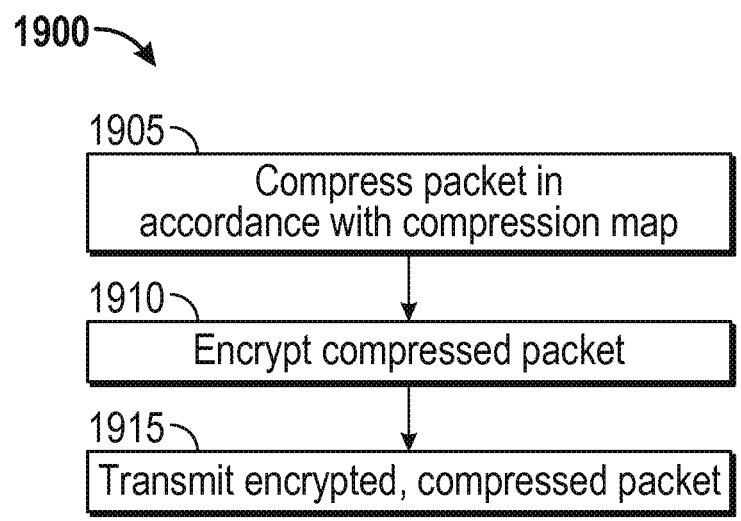
FIG. 19 is flowchart of an exemplary process of compressing and transmitting a packet header and payload in accordance with an exemplary embodiment.

FIG. 19 is flowchart of an exemplary method 1900 of compressing and transmitting a packet header and payload in accordance with an embodiment. The method 1900 may be used to transmit a packet header and payload compressed as discussed regarding in FIGS. 5A, 5B, 6A, 6B, 11, 13, and 14, for example. The packet may be generated at either the AP 104 or the STA 106 and transmitted to another node in the wireless network 100. Although the method 1900 is described below with respect to the elements of the wireless device 202t, other components may be used to implement one or more of the steps described herein.

At block 1905, the packet header and payload are compressed in accordance with a compression map to obtain a compressed packet. The compression map may include a run-length encoded data set identifying at least one data fields of the packet header or payload to compress. The compression may be performed by the processor 204 and/or the DSP 220, for example. In some embodiments, the packet payload may be compressed separately from the packet header.

At block 1910, the compressed packet is encrypted. In particular embodiments only the compressed packet payload is encrypted while the compressed packet payload remains unencrypted in others. Additionally, in some embodiments, the encrypted part of the packet may be compressed separately from the unencrypted part of the packet. Furthermore, in other embodiments, additional header fields may be added to the compressed packet, such as a ccmp field and a mic field. The encryption may be performed by the processor 204 and/or the DSP 220, for example.

At block 1915, the compressed packet is wirelessly transmitted. The transmission may be performed by the transmitter 210 of wireless device 202t, for example.

Figure 20:
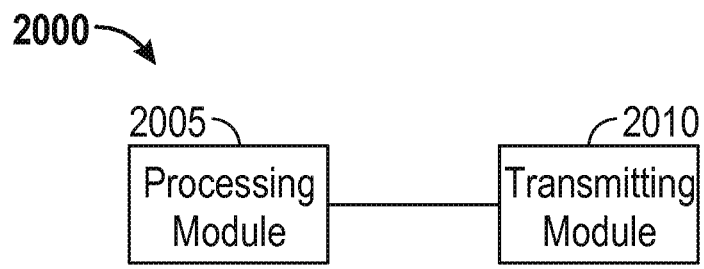
FIG. 20 is a functional block diagram of an exemplary wireless device that may be employed within the wireless communication system of FIG. 1.

FIG. 20 is a functional block diagram of an exemplary wireless device 2000 that may be employed within the wireless communication system of FIG. 1. The wireless device 2000 comprises a processing module 2005 for compressing a packet header or payload in accordance with a compression map. The processing module 2005 may be configured to perform one or more of the functions discussed above with respect to the blocks 1905 and 1910 of FIG. 19. The processing module 2005 may correspond to one or more of the processor 204 and the DSP 220. The wireless device 2000 further comprises a transmitting module 2010 for wirelessly transmitting the compressed packet. The transmitting module 2010 may be configured to perform one or more of the functions discussed above with respect to the block 1915 illustrated in FIG. 19. The transmitting module 2010 may correspond to the transmitter 210.

Moreover, in one aspect, means for compressing a packet in accordance with a compression map may comprise the processing module 2005. In yet another aspect, means for transmitting the compressed packet may comprise the transmitting module 2010.

In some wireless communication systems, the values in various fields of transmitted packet headers and payloads may be fixed from transmitted packet to transmitted packet. The processing module 2005 in particular embodiments may determine which fields contain values that are fixed and compress those fields before transmission. For example, the wireless device 202t may compress fields corresponding to MAC addresses, IP addresses, and port numbers since the particular fields may be fixed when the wireless device 202t and the wireless device 202r are known to be in wireless communication.

In yet other embodiments, the processing module 2005 may verify whether a packet is eligible for compression. The processing module 2005 may verify that a set of compressed parts values are the same as the values in the packet. To make this determination, the processing module 2005 may perform an XOR operation of the compressible packet with the compressed parts values or data contents. If the determination is zero, the compressible parts of the packet are the same as the set compressed parts values, so the packet is eligible for compression. Furthermore, in some embodiments, the processing module 2005 may signal that a packet is compressed. For example, the processing module 2005 may place a particular value, which corresponds to a compressed packet, within the frame type field or the frame subtype field of the frame control field 302 or 402.

Figure 21:
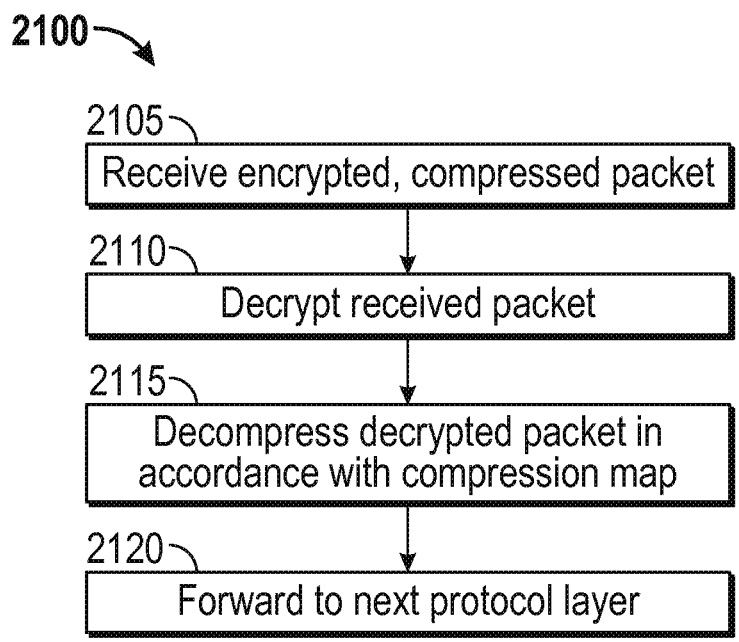
FIG. 21 is flowchart of an exemplary process of receiving and decompressing a packet header and payload in accordance with an exemplary embodiment.

FIG. 21 is flowchart of an exemplary process 2100 of receiving and decompressing a packet header and payload in accordance with an exemplary embodiment. The method 2100 may be used to receive a packet header and payload compressed as discussed regarding FIGS. 5A, 5B, 6A, 6B, 11, 13, and 14, for example. The packet may be received at either the AP 104 or the STA 106 from another node in the wireless network 100. Although the method 2100 is described below with respect to the elements of the wireless device 202r, other components may be used to implement one or more of the steps described herein.

At block 2105, a wireless communication comprising the encrypted, compressed packet is received. The reception may be performed by the receiver 212 of wireless device 202r, for example.

At block 2110, the encrypted portions of the received packet are decrypted. The processing may be performed by the processor 204 and/or the DSP 220, for example.

At block 2115, the decrypted packet is decompressed in accordance with a decompression map. The decompression map may include a run-length encoded data set identifying at least one data field of the packet to decompress. After decompression, the obtained packet may be identical or correspond to the transmitted packet data before compression or encryption, for example, by determining and placing calculated or stored values for compressed data fields. In some embodiments, the packet payload may be decompressed separately from the packet header. The processing may be performed by the processor 204 and/or the DSP 220, for example.

At block 2120, the obtained packet is forwarded to the next protocol layer for further processing. The forwarding and processing may be performed by the processor 204 and/or the DSP 220, for example.

Figure 22:
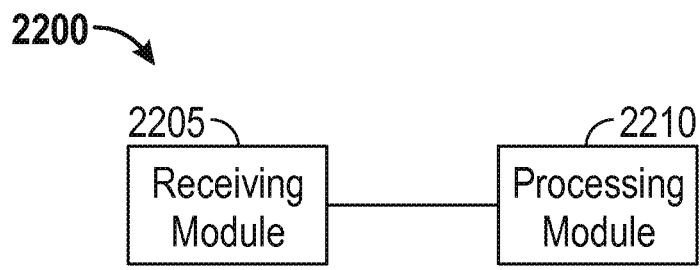
FIG. 22 is a functional block diagram of another exemplary wireless device that may be employed within the wireless communication system of FIG. 1.

FIG. 22 is a functional block diagram of another exemplary wireless device 2200 that may be employed within the wireless communication system of FIG. 1. The device 2200 comprises a receiving module 2205 for wirelessly receiving a wireless communication comprising a compressed, encrypted packet. The receiving module 2205 may be configured to perform one or more of the functions discussed above with respect to the block 2105 illustrated in FIG. 21. The receiving module 2205 may correspond to the receiver 212. The wireless device 2200 further comprises a processing module 2210 for processing the received packet. The processing module 2210 may be configured to perform one or more of the functions described above with respect to the blocks 2110, 2115, and 2120 illustrated in FIG. 21. The processing module 2210 may correspond to one or more of the processor 204, signal detector 218, and the DSP 220.

Moreover, in one aspect, means for receiving a packet comprising a packet header and payload may comprise the receiving module 2205. In another aspect, means for decompressing the packet in accordance with a decompression map may comprise the processing module 2210. In yet another aspect, means for determining whether the packet is compressed may comprise the processing module 2210.

In one embodiment, the processing module 2210 may be pre-programmed with the decompression map and compressed parts values or data contents. The pre-programming may occur at the time of manufacture or through communication with another device. For example, the wireless device 202*t* or wireless device 202*r* may determine whether the data of corresponding data fields of two packets are the same to obtain the decompression map. In another case, the processing module 2210 may receive the decompression map and compressed parts values in a received data packet or packets from the wireless device 202*t*.

In yet other embodiments, the processing module 2210 may determine whether a packet is compressed. Since some packets may be compressed while other packets may not, the processing module may advantageously first determine whether a packet is compressed before determining how to process the packet. The processing module 2210 may determine, for example, that the packet is compressed by evaluating a value within the frame type field or frame subtype field of the frame control field 302 or 402 of the packet.

What is claimed is:

1. A method for wireless communication implemented in a wireless communication device, the method comprising:
   compressing a packet in accordance with a compression map, the packet comprising a packet header and a packet payload, the compression map comprising a run-length encoded data set identifying at least one data field of the packet header and the packet payload to compress and wherein compressing the packet further excluding data of at least one data field identified by the compression map; and
   transmitting the compressed packet.

2. The method of claim 1, wherein the compression map directs compression of a data field when data of the data field of a first packet is the same as data of a corresponding data field of a second packet.

3. The method of claim 1, wherein the compression map directs compression of all data fields of the packet payload except at least one checksum data field, a sequence number data field, and an acknowledgment number data field.

4. The method of claim 1, wherein the compression map directs compression of all data fields of the packet header except a frame control data field, an address 1 data field, an address 2 data field, a sequence control data field, a counter-mode/cbc-mac protocol data field, a message integrity check data field, and a frame control sequence data field.

5. A method for wireless communication implemented in a wireless communication device, the method comprising:
   receiving a packet comprising a packet header and a packet payload; and
   decompressing the packet in accordance with a decompression map, the decompression map comprising a run-length encoded data set identifying at least one data field of the packet header and the packet payload to decompress and wherein decompressing the packet further excluding data of at least one data field identified by the decompression map.

6. The method of claim 5, wherein said decompressing the packet comprises determining stored data values for at least one data field identified by the decompression map.

7. The method of claim 6, wherein the decompression map directs decompression of a data field when data of the data field of a first packet is the same as data of a corresponding data field of a second packet.

8. The method of claim 6, wherein the decompression map directs decompression of all data fields of the packet payload except at least one checksum data field, a sequence number data field, and an acknowledgment number data field.

9. The method of claim 6, wherein the decompression map directs decompression of all data fields of the packet header except a frame control data field, an address 1 data field, an address 2 data field, a sequence control data field, a counter-mode/cbc-mac protocol data field, a message integrity check data field, and a frame control sequence data field.

10. An apparatus operable in a wireless communication system comprising:
    a processor configured to compress a packet in accordance with a compression map, the packet comprising a packet header and a packet payload, the compression map comprising a run-length encoded data set identifying at least one data field of the packet header and the packet payload to compress and wherein compressing the packet further excluding data of at least one data field identified by the compression map; and
    a transmitter configured to transmit the compressed packet.

11. The apparatus of claim 10, wherein the compression map directs compression of a data field when data of the data field of a first packet is the same as data of a corresponding data field of a second packet.

12. The apparatus of claim 10, wherein the compression map directs compression of a data field corresponding to a data field identified in a decompression map stored in a receiver configured to receive the compressed packet.

13. The apparatus of claim 10, wherein the compression map does not direct compression of a first set of data fields of the packet payload, the first set of data fields comprising at least one checksum data field, a sequence number data field, and an acknowledgment number data field.

14. The apparatus of claim 10, wherein the compression map does not direct compression of a second set of data fields of the packet header, the second set of data fields comprising a frame control data field, an address 1 data field, an address 2 data field, a sequence control data field, a counter-mode/cbc-mac protocol data field, a message integrity check data field, and a frame control sequence data field.

15. The apparatus of claim 10, wherein the packet comprises an aggregated media access control service data unit (A-MSDU), and the packet payload comprises at least one A-MSDU subframe.

16. The apparatus of claim 15, wherein the processor is further configured to signal in a header of the compressed packet that at least one A-MSDU subframe in a payload of the compressed packet is compressed.

17. The apparatus of claim 15, wherein the processor is further configured to signal in an A-MSDU subframe of the compressed packet that the A-MSDU subframe is compressed.

18. The apparatus of claim 15, wherein a payload of the compressed packet comprises a decompression map identifying at least one MSDU subframe to decompress and at least one MSDU subframe not to decompress.

19. The apparatus of claim 10, wherein the packet comprises an aggregated media access control protocol data unit (A-MPDU), and the packet payload comprises at least one MPDU.

20. The apparatus of claim 19, wherein the processor is further configured to signal in a header of the compressed packet that at least one MPDU in a payload of the compressed packet is compressed.

21. The apparatus of claim 19, wherein the processor is further configured to signal in a MPDU of the compressed packet that the MPDU is compressed.

22. The apparatus of claim 19, wherein a payload of the compressed packet comprises a decompression map, the decompression map identifying at least one MPDU to decompress and at least one MPDU not to decompress and comprising a second run-length encoded data set identifying at least one data field of the header and payload of the compressed packet to decompress.

23. The apparatus of claim 10, wherein the processor is further configured to compress an encrypted portion of the packet separately from compressing an unencrypted portion of the packet.

24. The apparatus of claim 10, wherein the processor is further configured to compress the packet prior to encrypting of a portion of the packet.

25. An apparatus operable in a wireless communication system comprising:
a receiver configured to receive a packet comprising a packet header and a packet payload; and
a processor configured to decompress the packet in accordance with a decompression map, the decompression map comprising a run-length encoded data set identifying at least one data field of the packet header and the packet payload to decompress and wherein decompressing the packet further excluding data of at least one data field identified by the decompression map.

26. The apparatus of claim 25, wherein the processor is configured to decompress the packet by determining stored data values for at least one data field identified by the decompression map.

27. The wireless apparatus of claim 25, wherein the decompression map does not direct decompression of a first set of data fields of the packet payload and a second set of data fields of the packet header, the first set of data fields comprising at least one checksum data fields, a sequence number data field, and an acknowledgment number data field, the second set of data fields comprising a frame control data field, an address 1 data field, an address 2 data field, a sequence control data field, a counter-mode/cbc-mac protocol data field, a message integrity check data field, and a frame control sequence data field.

28. The apparatus of claim 25, wherein
the packet comprises an aggregated media access control service data unit (A-MSDU), the packet payload comprises one or more A-MSDU subframes and the decompression map, the decompression map identifying at least one MSDU subframe to decompress and at least one MSDU subframe not to decompress, and
the processor is further configured to detect a first signal in a first A-MSDU subframe of the packet that the first A-MSDU subframe is compressed or a second signal in the packet header that at least one A-MSDU subframe in the packet payload is compressed.

29. The apparatus of claim 25, wherein
the packet comprises an aggregated media access control protocol data unit (A-MPDU), the packet payload comprises at least one MPDU and the decompression map, the decompression map identifying at least one MPDU to decompress and at least one MPDU not to decompress, and
the processor is further configured to detect a first signal in a first MPDU of the packet that the first MPDU is compressed or a second signal in the packet header that at least one MPDU in the packet payload is compressed.

30. An apparatus operable in a wireless communication system comprising:
means for compressing a packet in accordance with a compression map, the packet comprising a packet header and a packet payload, the compression map comprising a run-length encoded data set identifying at least one data field of the packet header and the packet payload to compress and wherein means for compressing the packet further excluding data of at least one data field identified by the compression map; and
means for transmitting the compressed packet.

31. An apparatus operable in a wireless communication system comprising:
means for receiving a packet comprising a packet header and a packet payload; and
means for decompressing the packet in accordance with a decompression map, the decompression map comprising a run-length encoded data set identifying at least one data field of the packet header and the packet payload to decompress and wherein means for decompressing the packet further excluding data of at least one data field identified by the decompression map.

32. A non-transitory computer readable medium comprising instructions that when executed cause an apparatus to:
compress a packet in accordance with a compression map, the packet comprising a packet header and a packet payload, the compression map comprising a run-length encoded data set identifying at least one data field of the packet header and the packet payload to compress and wherein compress the packet further exclude data of at least one data field identified by the compression map; and
transmit the compressed packet.

33. A non-transitory computer readable medium comprising instructions that when executed cause an apparatus to:
receive a packet comprising a packet header and a packet payload; and decompress the packet in accordance with a decompression map, the decompression map comprising a run-length encoded data set identifying at least one data field of the packet header and the packet payload to decompress and wherein decompress the packet further exclude data of at least one data field identified by the decompression map.

* * * * *